Figure 1:
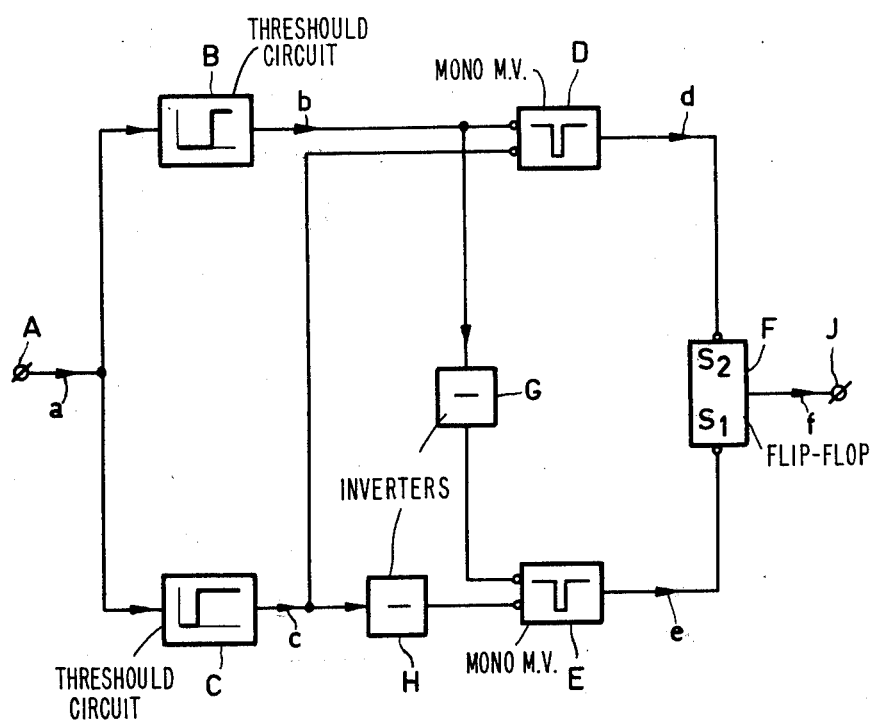

United States Patent [19]

Brouckaert

[11] 4,015,144
[45] Mar. 29, 1977

[54] CIRCUIT ARRANGEMENT FOR CONVERSION OF AN ANALOG SIGNAL INTO A BINARY SIGNAL

[75] Inventor: Freddy Achiel Cornelius Brouckaert, Eindhoven, Netherlands

[73] Assignee: U.S. Philips Corporation, New York, N.Y.

[22] Filed: Nov. 7, 1974

[21] Appl. No.: 521,584

[30] Foreign Application Priority Data

Nov. 21, 1973 Netherlands ...................... 7315904

[52] U.S. Cl. .............................. 307/261; 328/164; 307/235 N
[51] Int. Cl.² ........................................ H03K 5/00
[58] Field of Search .......... 328/164, 116, 117, 163, 328/115; 358/37; 178/DIG. 25, 70; 179/170 T; 307/273, 268, 261, 235 N, 103

[56] References Cited

UNITED STATES PATENTS

| | | | |
|---|---|---|---|
| 3,327,230 | 6/1967 | Konian | 307/235 N X |
| 3,524,164 | 8/1970 | Cox et al. | 360/42 X |
| 3,571,730 | 3/1971 | Webb | 328/117 |
| 3,585,507 | 6/1971 | Bickel | 328/116 |
| 3,588,712 | 6/1971 | Uozumi | 328/117 X |
| 3,611,162 | 10/1971 | Tochitani | 307/235 X |
| 3,723,649 | 3/1973 | Pitegoff et al. | 328/164 X |
| 3,760,281 | 9/1973 | Hogg | 328/117 X |
| 3,816,761 | 6/1974 | Ahmed | 307/235 |
| 3,838,347 | 9/1974 | Lauffer | 307/268 X |

Primary Examiner—Thomas J. Sloyan
Attorney, Agent, or Firm—Frank R. Trifari; Henry I. Steckler

[57] ABSTRACT

A circuit arrangement in which an analog signal is converted into a binary signal with the aid of two threshold limiter circuits one of which is active near a maximum and the other is active near a minimum value of the analog signal, and with two monostable multivibrators connected thereto, followed by a set-reset flip-flop. Small signal passages of the thresholds near the maximum and minimum analog signal values become clearly manifest as a signal transition in the binary signal that can be displayed.

4 Claims, 2 Drawing Figures

CIRCUIT ARRANGEMENT FOR CONVERSION OF AN ANALOG SIGNAL INTO A BINARY SIGNAL

The invention relates to a circuit arrangement for converting an analog signal into a binary signal, provided with two threshold limiter circuits having different signal thresholds each connected to an input of the circuit arrangement for the supply of the analog signal and via a flipflop to an output for the supply of the derived binary signal in which a binary transition may occur as a function of the analog signal passing a signal threshold.

Such a circuit arrangement is described in U.S. Pat. No. 3,723,649. This application states that in facsimile the binary signal obtained has a better quality upon display than the analog signal when the displayed picture is, for example, a text of a document. Irregularities present in the analog signal, such as noise at a maximum and minimum signal value do not occur on display due to the conversion into the binary signal. Furthermore this specification states that the use of two threshold limiter circuits, one of which has the signal threshold below the maximum signal value and the other has the threshold above the minimum signal value, provides the possibility of eliminating the noise influence at the two signal thresholds. Noise occurring near a signal threshold results in a signal transition in the binary output signal upon each threshold passage. To prevent this, the flipflop is provided so that it is achieved that after the passage of a threshold and an associated signal transition in the binary output signal a subsequent passage of the same threshold does not have any influence on the output signal. Only a signal passage of the other threshold will result in a signal transition in the binary output signal. It is found that after the first passage of a threshold the relevant threshold limiter circuit no longer influences the output signal.

This application, while using the two threshold limiter circuits and the flipflop, relates to a different field of use, namely the field of making irregularities occurring at a certain level in the analog signal more observable. In television, this analog signal is, for example, a video signal generated with the aid of a television camera. Upon direct display of an analog video signal with irregularities near a signal level to be considered, these irregularities are hardly noticeable on a display screen. The use of a single threshold limiter circuit with a signal threshold located at a determined signal level results in each small threshold passage of the analog signal to cause a large signal transition in the binary signal. Thus, upon display of the threshold passages, i.e. the irregularities in the analog signal to be observed clearly become manifest.

One signal level at a time could be checked for irregularities with the single threshold limiter circuit. The checked level can be displaced by making the signal threshold adjustable.

It is an object of the invention to realize a circuit arrangement with which, for example, in television two signal levels can be simultaneously checked in one picture which corresponds as much as possible to the picture that would be given by the analog signal. To this end the circuit arrangement according to the invention is characterized in that it is formed with two monostable multivibrators connected to each threshold limiter circuit while the outputs of the multivibrators are connected to the flipflop which is connected to the output of the circuit arrangement.

The invention is based on the recognition of the fact that the signal irregularities or the noise in an adjusted threshold signal level can be detected by preventing the first threshold passage from influencing the output signal and by ensuring that only the second and subsequent threshold passages give signal transitions in the binary output signal. Upon television display a picture is obtained which corresponds as much as possible to the picture given by the analog signal.

The invention will be described in greater detail by way of example with reference to the following figures.

Figure 2:
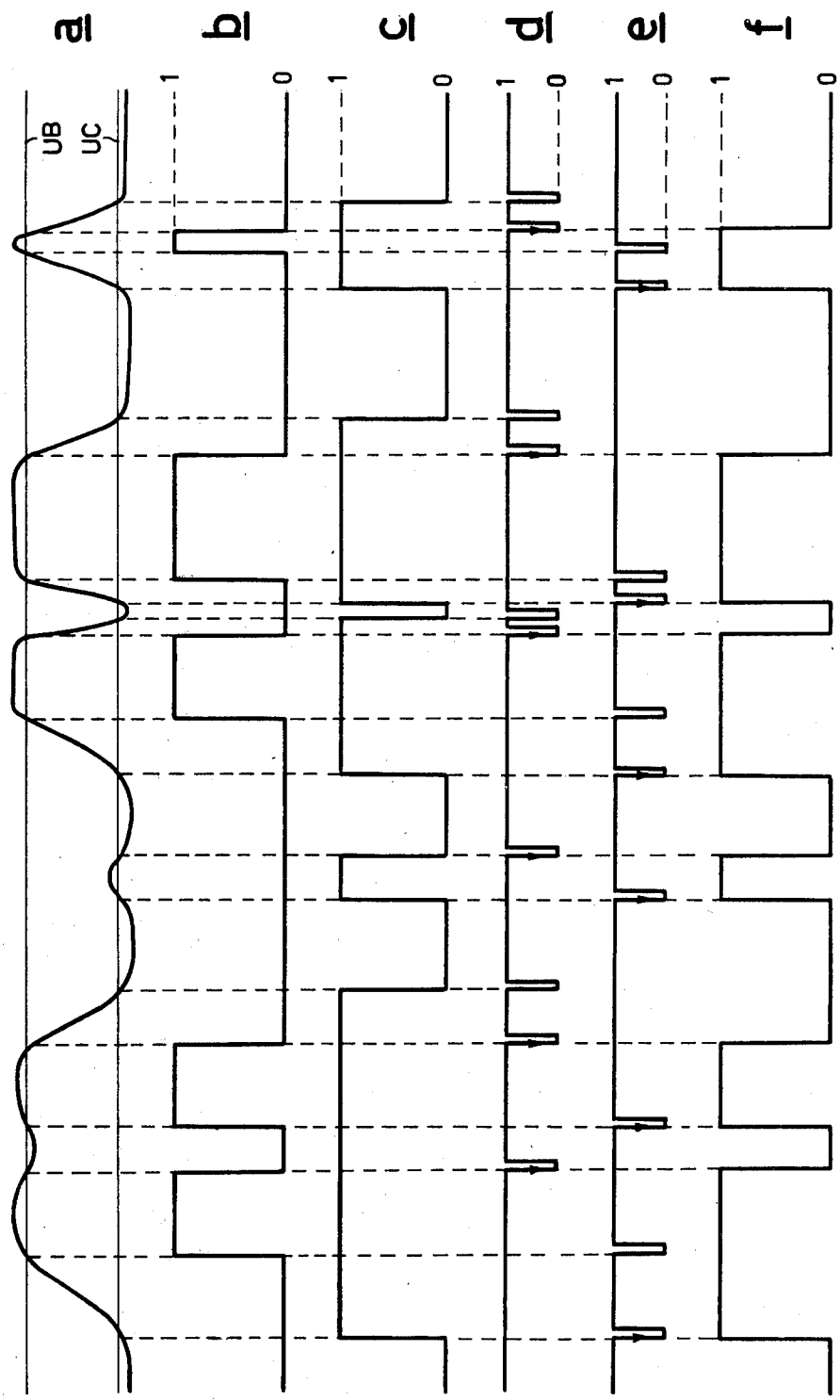

FIG. 1 is a block schematic diagram of a circuit arrangement according to the invention and FIG. 2 shows for the purpose of illustration some signals as a function of time, occurring in the circuit arrangement according to FIG. 1.

FIG. 1 shows an embodiment of a circuit arrangement according to the invention which is formed with an input A for the supply of an analog signal a plotted as a function of time in FIG. 2. The signal a is, for example, a television picture signal supplied by a television camera. The signal a of FIG. 2 provides the picture information and in a manner not shown the picture signal can be combined with line and field synchronizing pulses and equalising pulses yielding a video signal. Since the occurrence of synchronizing and equalising pulses is irrelevant for the invention, these are not shown in FIG. 2.

The analog signal a is applied from the input A to two threshold limiter circuits B and C having different signal thresholds as is diagrammatically shown at the circuits B and C of FIG. 1. In FIG. 2 the different signal thresholds of the circuits B and C at the signal a are denoted by UB and UC, respectively. The threshold UC is located, for example, at a signal level near the so-called black level in television and the threshold UB occurs near a maximum signal value, the so-called peak white value.

FIG. 2 shows at the signal a the threshold UC occurring just above the black level as a minimum signal value of the signal a, while the threshold UB is located just below the peak white value as a maximum signal value. Starting from the signal a shown, it follows that the threshold limiter circuit B with the threshold UB provides a signal denoted by b in FIG. 2. Likewise the threshold limiter circuit C with the threshold UC provides a signal c. In the manner shown in FIG. 2 the binary signals b and c and the signals to be further described are formed from the analog signal a with two signal values denoted by a logical 1 and 0.

FIG. 1 shows that the signals b and c provided by the circuits B and C are applied each to an input of a monostable multivibrator D. Instead of the direct supply to two inputs it is alternatively possible to combine the signals b and c and then to apply them to one input of the multivibrator D. A trailing signal edge in the signal b or c results in a triggering action on the multivibrator D supplying a short-locating pulse. Starting from the signals b and c of FIG. 2, it follows that the multivibrator D provides a signal d. Furthermore the signals b and c are applied through signal inverters G and H to a second monostable multivibrator E which is likewise activated by trailing signal edges. Due to the signal inversion through the signal inverter circuit (G, H) the leading signal edges in the signals b and c according to FIG. 2 are active as signal trigger edges so that the multivibrator E yields a signal e shown in FIG. 2. Instead of an embodiment of the multivibrator E reacting to trailing signal edges, an embodiment reacting to leading signal edges might be used in which case the signal inverter circuit (G, H) has become superfluous.

The multivibrators D and E apply the signals and d and e to an input of a flipflop F. The flipflop F is shown with two inputs and one output, but further inputs and outputs not shown may be present. The signal e is applied to a set input $S_1$ of the flipflop F and the signal d is applied to a reset input $S_2$. The output of the flipflop F then conveys a signal f which becomes available at an output J of the circuit arrangement. For the operation of the flipflop F, the occurrence of a logical 1 at the input $S_1$ or $S_2$ has no influence, while a logical 0 at the set input $S_1$ results in a logical 1 and a logical 0 at the reset input $S_2$ results in a logical 0 at the output. When the flipflop F has assumed the described state, the logical 0 at the input $S_1$ or $S_2$ has no influence. Consequently the signals d and e yield the signal f of FIG. 2. In the signals d and e the trailing edges where the flipflop F changes over, are denoted by arrow heads. It is found that in the succession of occurrence of a logical 0 in the signal d or e only the first one occurring activates the flipflop F. After the occurrence of a logical 0 in the signal d (or e) a subsequent activation is only effected by a logical 0 in the signal e (or d).

A comparison of the analog signal a and the binary signal f derived therefrom shows that small signal passages in the signal a of the thresholds UB and UC are accentuated in the signal f. Upon display of the signal f by means of a television display apparatus the small signal passages become manifest as a black in a white region or a white in a black region, which regions are associated with the signal a. If the signal a were directly applied to the display apparatus, the small signal changes in the displayed picture would hardly or not be noticeable. Due to the conversion of the analog signal a into the binary signal f the signal irregularities at the two signal levels (UB and UC) become simultaneously and clearly manifest in one and the same picture upon display. As a result the circuit arrangement according to FIG. 1 may be utilised for checking analog signals for signal irregularities at certain signal levels. It is possible to observe an object with the aid of a television camera and to apply the signal (a) supplied by the camera to the circuit arrangement according to FIG. 1 so that upon display of the binary signal (f) derived therefrom irregularities occurring near the object are clearly noticeable. Examples of such an object are circuits integrated in a semiconductor body, printed circuits boards and the like. Generally there applies that the arrangement according to FIG. 1 may be used for any visual inspection of objects for clear observation of irregularities. By adapting the signal thresholds UB and UC the object irregularities can be observed on display at any level. The position of the signal thresholds near the black level and the peak white value is very advantageous in case of visual inspection because the irregularities near these levels would be very difficult to observe without using the circuit arrangement.

Instead of display and visual inspection it is alternatively possible to determine the signal transitions in the binary signal directly and electronically and to interpret them as irregularities in the analog signal.

What is claimed is:

1. A circuit arrangement comprising input means for receiving an analog signal; two threshold limiter circuits each having a signal threshold differing from each other, an input coupled to said input means, and an output; two monostable multivibrators each coupled to both of said limiter circuit outputs and each having an output; said monostable multivibrators responding to threshold crossings of differing directions respectively, and a flipflop circuit coupled to said multivibrator outputs and having an output means for supplying a digital signal having transitions as a function of the analog signal passing said signal thresholds; whereby said circuit arrangement is operable to regard as redundant and without effect second crossings of the two thresholds in the same direction but to respond to each crossing of either threshold in a direction which differs from that of the previous threshold crossing.

2. A circuit arrangement as claimed in claim 1, wherein each threshold limiter circuit is formed with a signal threshold located near a maximum and a minimum signal value respectively of the analog signal for checking signal irregularities.

3. A circuit arrangement as claimed in claim 1, wherein the flipflop comprises a set and a reset input one input being coupled to one multivibrator and the other input is coupled to the other multivibrator.

4. A circuit arrangement as claimed in claim 1, wherein said multivibrators can be activated by rectified signal trigger edges, and further comprising two inverter circuits coupled between one of the multivibrators to the outputs of the threshold limiter circuits respectively.

* * * * *